United States Patent [19]

Mo

[11] Patent Number: 4,948,755
[45] Date of Patent: Aug. 14, 1990

[54] METHOD OF MANUFACTURING SELF-ALIGNED CONFORMAL METALLIZATION OF SEMICONDUCTOR WAFER BY SELECTIVE METAL DEPOSITION

[75] Inventor: Roy Mo, Flushing, N.Y.

[73] Assignee: Standard Microsystems Corporation, Hauppauge, N.Y.

[21] Appl. No.: 378,490

[22] Filed: Jul. 11, 1989

Related U.S. Application Data

[63] Continuation of Ser. No. 283,025, Dec. 9, 1988, abandoned, which is a continuation of Ser. No. 107,487, Oct. 8, 1987, abandoned.

[51] Int. Cl.⁵ ............................................ H01L 21/283
[52] U.S. Cl. ....................................... 437/195; 437/192; 437/193; 437/200; 437/246; 357/71
[58] Field of Search ............... 437/192, 193, 195, 200, 437/246, 203, 189; 357/67, 71

[56] References Cited

U.S. PATENT DOCUMENTS

| | | | |
|---|---|---|---|
| 4,582,563 | 4/1986 | Hazuki et al. | 437/194 |
| 4,630,357 | 12/1986 | Rogers et al. | 437/200 |
| 4,670,967 | 6/1987 | Hazuki | 148/DIG. 19 |
| 4,764,484 | 8/1988 | Mo | 437/195 |
| 4,814,285 | 3/1989 | Matlock et al. | 437/195 |

FOREIGN PATENT DOCUMENTS

| | | | |
|---|---|---|---|
| 0224013 | 6/1987 | European Pat. Off. | 437/195 |
| 0117719 | 6/1985 | Japan | 437/192 |
| 0281539 | 12/1986 | Japan | 437/200 |

OTHER PUBLICATIONS

Moriya, T. et al., "A Planar Metallization Process...", *IEEE IEDM Tech. Dig.*, 1983, pp. 550-553.

*Primary Examiner*—Brian E. Hearn
*Assistant Examiner*—T. N. Quach
*Attorney, Agent, or Firm*—Hopgood, Calimafde, Kalil, Blaustein & Judlowe

[57] ABSTRACT

A method is disclosed for fabricating a semiconductor integrated circuit which includes the selective deposition of a metal, such as tungsten, into a contact opening formed in a dielectric layer, followed by the deposition of a thin silicon layer over the dielectric and metal-filled opening and the deposition of a second dielectric layer over the thin silicon layer. An opening or trench is formed in the upper second dielectric layer using the silicon as an etch stop, and a metal such as tungsten is selectively deposited to fill the trench wherever the exposed silicon is present. In one embodiment of the invention, prior to the filling of the trench, the exposed silicon is reacted with a blanket layer of a metal to form a metal silicide layer at the lower surface of the trench.

13 Claims, 2 Drawing Sheets

METHOD OF MANUFACTURING SELF-ALIGNED CONFORMAL METALLIZATION OF SEMICONDUCTOR WAFER BY SELECTIVE METAL DEPOSITION

This application is a continuation of application Ser. No. 283,025, filed Dec. 9, 1988, now abandoned, which is a continuation of application Ser. No. 107,487, filed Oct. 8, 1987, now abandoned.

BACKGROUND OF THE INVENTION

The present invention relates generally to the fabrication of semiconductor integrated circuits, and more particularly to the fabrication of very large-scale integration (VLSI) circuits.

Recent developments in MOS VLSI integrated circuits have resulted in integrated circuits capable of operating at higher speeds and characterized by reduced-size geometries and greater packing densities. This trend toward increasingly complex MOS devices has pushed the limits of existing materials and fabrication processes. As geometries have shrunk to one micron and less, circuit densities have increased, contact holes have become smaller, and line widths have become narrower. The resistance of the elements in the device structure increases along with the RC time constants, thereby limiting the overall speed of the device.

One proposed solution to this problem has been the use of refractory metals, such as tungsten and their silicides, as a high-conductive, low-resistance, and highly reliable interconnect material. The use of these materials provides an alternate to polysilicon for first-level interconnections and gate electrodes and an alternate to aluminum for multilevel interconnects, and a way of planarizing contacts and via holes without the need for troublesome sloped contact etching.

One of the most difficult areas in VLSI multilevel metallization technology is topography. Planarization of a certain amount is required to overcome the topography created by the underlying structures. The achievement of desired planarization, however, typically requires a precise process control, increased process complexity, and a reduction in product yield.

In a conventional process used to fabricate a multilevel MOS integrated circuit, a dielectric layer is deposited on a surface of a substrate, a contact hole is formed in the dielectric, and a first metal layer is deposited and then etched. A second dielectric layer (interdielectric) is then deposited over the metal and a photoresist layer is deposited over the second dielectric layer. The structure is then subjected to a blanket etch back in an attempt to achieve planarization of the interdielectric. A via hole is then formed in the interdielectric to the upper level of the first metal layer. A second metal layer is then deposited and etched and extends through the via hole to contact the first metal layer. Thereafter, a passivation layer is deposited and etched.

There are, however, numerous problems associated with this conventional multilevel process, such as severe topography resulting in metal step coverage problems and residual metal Problems, which may cause electrical opens for the interconnects and intralevel electrical shorts between adjacent interconnects. Other drawbacks associated with this conventional process include electromigration on narrow interconnects (particularly when aluminum is used), and the need for a metal overlap around the via and contact holes (dogbone structure) which result in the reduction of device packing density and in a degraded circuit performance.

SUMMARY OF THE INVENTION

It is an object of the invention to provide an improved process for fabricating a MOS integrated circuit in which planarization is reliably achieved.

It is a further object of this invention to provide a process for fabricating VLSI multilevel integrated circuits in which the planarization of the interdielectric layer and etching of the metal layer are eliminated.

It is another object of the invention to provide a process of the type described, which allows for the fabrication of more reliable VLSI integrated circuits and devices at high yield and at high packing densities.

It is yet a further object of the invention to provide a process of fabricating a VLSI structure in which self-alignment of the metallization layers is reliably achieved.

To these ends, the process of the invention includes the selective deposition of a metal, such as tungsten, into a contact opening formed in a dielectric layer, followed by the deposition of a thin silicon layer over the dielectric and metal-filled opening, and the deposition of a second dielectric layer over the thin silicon layer. An opening or trench is formed in the upper second dielectric layer, and a metal such as tungsten is selectively deposited to fill the trench wherever the exposed silicon is present. In one embodiment of the invention, prior to the filling of the trench, the exposed silicon is reacted with a blanket layer of a metal to form a metal silicide layer at the lower surface of the trench.

To the accomplishment of the above and any other objects as may hereinafter appear, the present invention is directed to a process for fabricating a VLSI MOS integrated circuit substantially as defined in the appended claims and as described in the following specification, as considered with the accompanying drawings.

BRIEF DESCRIPTION OF THE DRAWING p

FIGS. 1-4 are cross-sectional views of a VLSI integrated circuit shown during various stages of its fabrication in accordance with the process of the invention, FIG. 4 illustrating the completed integrated circuit structure; and FIG. 5 is a cross-sectional view similar to FIG. 4 illustrating a multilevel integrated circuit fabricated according to the process of the invention.

DESCRIPTION OF THE PREFERRED EMBODIMENTS

Figure 1:
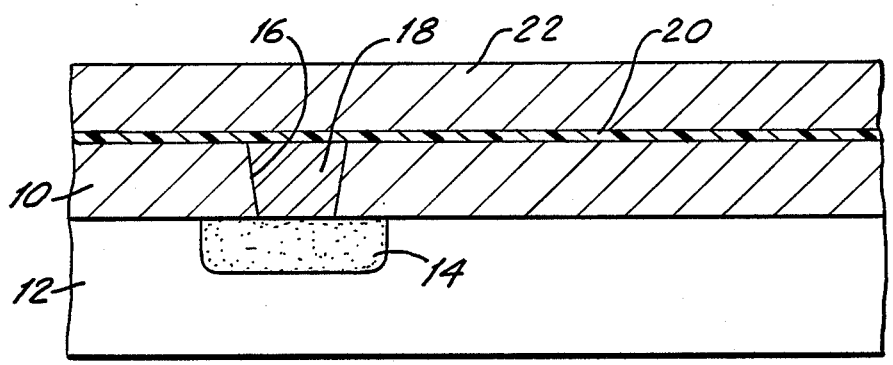

As shown in FIG. 1, in the process of the invention, a dielectric (silicon oxide) layer 10 of between 0.3 and 225 microns is deposited on a silicon substrate 12 in which, as is typical, a region 14 of an opposite conductivity to the substrate is formed such as by implantation or diffusion. The dielectric layer 10 may also be a silicon nitride or an oxynitride film. Thereafter, by the use of a conventional photolithographic and etch procedure a contact hole 16 is formed in dielectric layer 10 and extends to the surface of region 14.

A metal, such as tungsten, is then chemical selectively deposited by a chemical vapor deposition (CVD) procedure so that the metal deposits only onto a silicon surface and not on the silicon dioxide dielectric layer, such that only the contact hole 16 is filled or covered with tungsten 18 as shown in FIG. 1. At this stage, the dielectric layer 10 is free of metal. Thereafter, as shown in FIG. 1, a thin (50 - 2,500° A) layer 20 of silicon (e.g., amorphous silicon or polysilicon) is deposited over the dielectric layer 10 and tungsten-filled contact hole 16. Dielectric layer 22 may also be a silicon nitride or oxynitride film. Next, a second dielectric (silicon oxide) layer 22 of a thickness of between 0.3 and 2.5 microns is deposited over the silicon layer 20.

Figure 2:
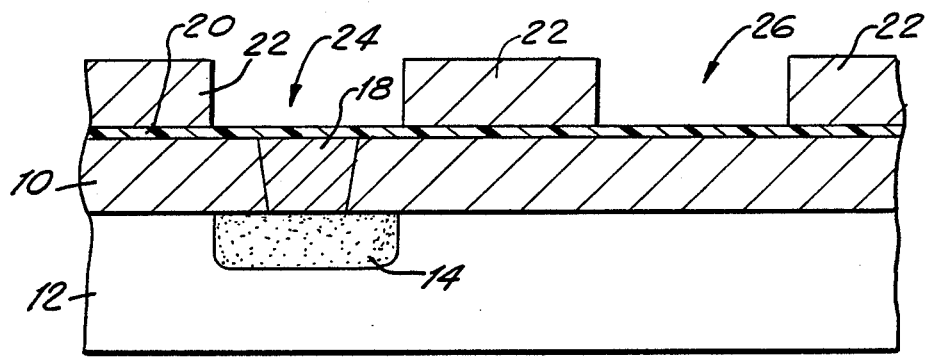

Thereafter, as shown in FIG. 2, by means of a per se conventional photolithography and each operation, the latter being either a dry plasma or wet chemical etch with the thin silicon layer 20 acting as a stop, metal trenches 24, 26 are formed in the dielectric layer 22. The depths of the metal trenches 24, 26 are the same as the thickness of the dielectric layer 22, that is, between 0.3 and 2.5 microns. Metal trench 24 is, as shown, overlying and in vertical alignment with the metal-filled contact hole 16.

Figure 3A:
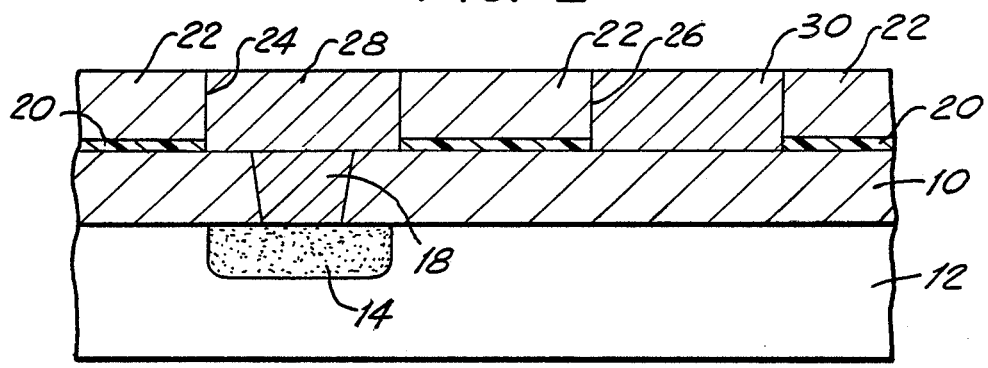
Figure 3B:
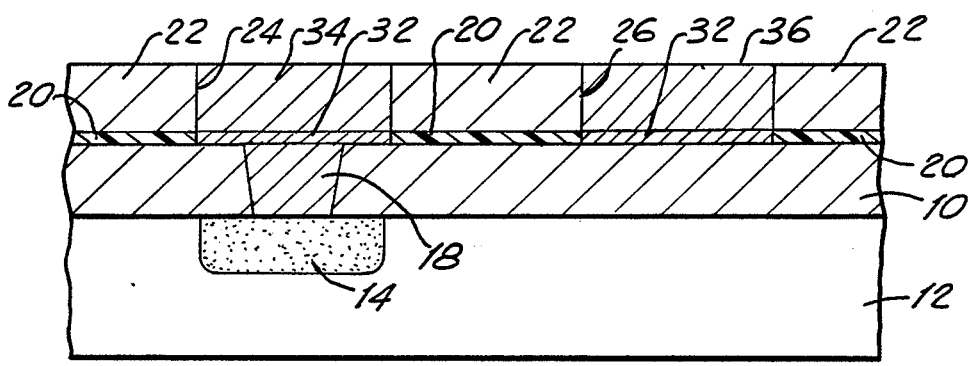

Thereafter, interconnects are put down on the structure of FIG. 2 by one of two presently preferred alternative techniques illustrated in FIGS. 3a and 3b. In the technique illustrated in FIG. 3a, a metal (e.g., tungsten) is selectively deposited as by a CVD process to fill the metal trenches 24, 26 with tungsten 28, 30, respectively, wherever an exposed surface of silicon layer 20 is present. In this process, the exposed portion of silicon layer 20 will be completely consumed so that the two metal regions, 18, 28 will be in physical and electrical conduct without any interfacial contact resistance therebetween.

In the alternative technique illustrated in FIG. 3b, a thin blanket layer (not shown) of metal (e.g., cobalt, titanium, tungsten, platinum, molybdenum, tantalum, palladium, or the like) is deposited and the structure is then heated to a suitable temperature, which depends on the type of material used; e.g., about 750° C for tungsten, so that the metal layer selectively reacts with the exposed silicon layer 20 wherever the metal is in contact with the silicon layer to form a conductive layer of metal silicide 32 at those locations. During this process the position of the silicon layer 20 overlying the tungsten-filled contact hole 16 will be completely consumed in the formation of the conductive metal silicide layer 32, at the bottoms of the trenches 24, 26, and thus will not cause interfacial contact resistance.

Thereafter, the unreacted portion of the metal layer over the upper surface of the dielectric layer 22 is selectively removed such as by a dry plasma or wet chemical etch. For example, if titanium is used for the metal layer, the unreacted titanium metal may be removed (etched away) by a mixture of ammonium hydroxide, hydrogen peroxide, and water. Thereafter, as shown in the structure of FIG. 3b, a metal 34, 36, such as tungsten, is selectively deposited by a CVD process to respectively fill trenches 24, 26. The metal in trench 24 overlies and is aligned with the tungsten in contact hole 16, and through the intermediate metal silicide layer 32 is in electrical contact with the metal-filled contact hole.

Figure 4:
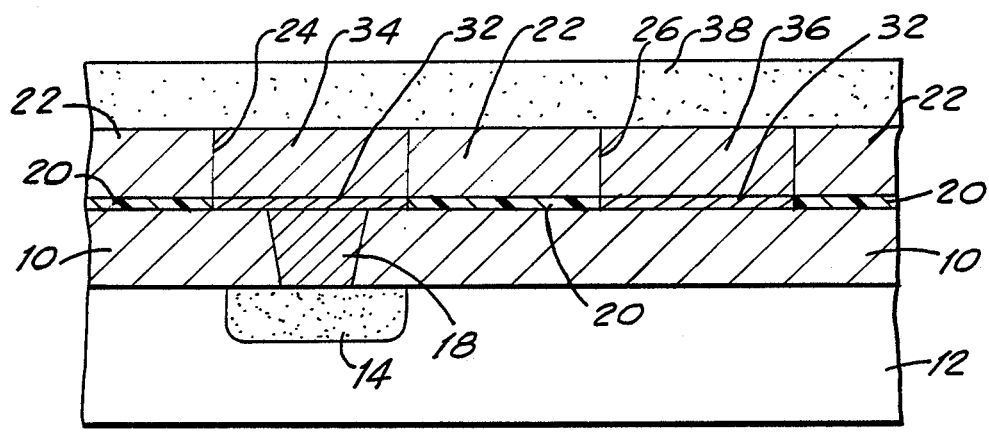

Thereafter, in a single-level process, the structure of FIG. 3a or 3b is covered with a passivation layer 38, as shown in FIG. 4, which illustrates such a passivation layer formed over the structure of FIG. 3b.

Figure 5:
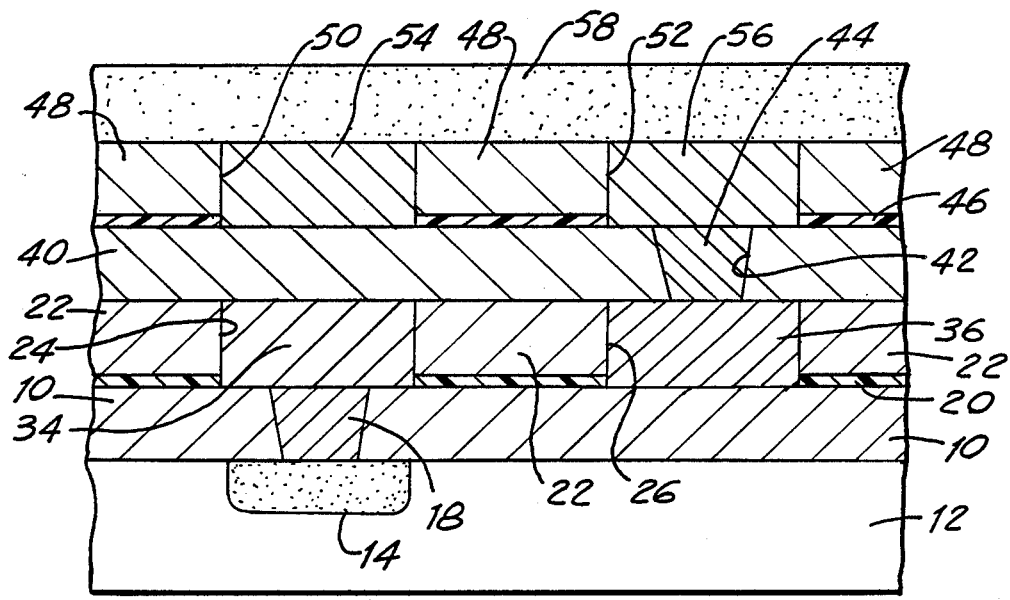

FIG. 5 illustrates the fabrication technique of FIGS. 1-4 extended to a multilevel metal process. The structure of FIG. 5 is fabricated by repeating the process steps illustrated in FIGS. 1-3 as described above. Thereafter, a second dielectric (e.g., silicon oxide) layer 40 is patterned and etched to form a via hole 42, which overlies and communicates with the upper surface of the metal-filled trench 26. The via hole 42 is then filled with a metal 44, e.g., tungsten, by a selective deposition process, in a manner similar to that described above.

Thereafter, a second thin layer 46 of silicon is deposited over the dielectric layer 40 and the metal-filled via hole 42. In a manner described previously, a dielectric layer 48 is then deposited over silicon layer 46 and is patterned and etched to form trenches 50 and 52. Thereafter, an interconnect deposition step, as illustrated in either FIG. 3a or 3b, is carried out to selectively deposit tungsten 54, 56 into the trenches 50, 52, respectively, the latter being in electrical conduct, with no interfacial contact resistance, with the tungsten metal in via hole 44 and thereby with the metal 36. As before, a passivation layer 58 is deposited over the upper surface of the upper dielectric layer 48 and the metal-filled trenches 54, 56.

It will be appreciated from the foregoing description of preferred embodiments that the fabrication process of the invention substantially eliminates two significant and difficult operations in VLSI fabrication, namely the planarization of the dielectric layer and the metal etching. The conformed metallization achieved by the inventive process provides more reliable VLSI devices, and the self-aligned metallization achieved allows for higher packing density of VLSI devices because metal overlapping the contact and via holes is no longer required. It will also be appreciated that modifications may be made to the embodiments of the invention described without necessarily departing from the spirit and scope of the invention.

What is claimed is:

1. A method for fabricating a semiconductor integrated circuit comprising the steps of providing a substrate, forming a first dielectric layer over an upper surface of said substrate, forming a contact hole in said first dielectric layer and extending to said upper surface of said substrate, selectively depositing a metal so as to fill said contact hole with said metal, forming a thin silicon layer overlying the remaining portion of said first dielectric layer and over said metal-filled contact hole, forming a second dielectric layer over said thin silicon layer, using said thin silicon layer as an etching stop, selectively removing portions of said second dielectric layer, thereby to form at lest one trench in said second dielectric layer overlying said metalfilled contact hole, and thereafter depositing a metal to fill said trench to substantially the upper surface of said second dielectric layer while at the same time consuming the portion of said thin silicon layer not protected by the remaining portion of said second dielectric layer, whereby said last-mentioned metal is in electrical contact with metal in said underlying contact hole and is substantially coplanar with the upper surface of said second dielectric layer.

2. The method of claim 1, in which said metals are tungsten.

3. The method of claim 1, in which at least one of said metals is tungsten.

4. The method of claim 1, in which said thin silicon layer is between 50 and 2,500 Angstroms in thickness.

5. The method of claim 1, in which said thin silicon layer comprises one of a polycrystalline film and an amorphous silicon film.

6. The method of claim 1, in which said trench is between 0.3 to 2.5 microns in depth.

7. The method of claim 2, in which said tungsten metal is selectively deposited by means of chemical vapor deposition.

8. The method of claim 1, in which each of said dielectric layers comprises one of a silicon oxide film, a silicon nitride film, and an oxynitride film.

9. The method of claim 1, in which said first and second dielectric layers are each between 0.3 to 2.5 microns in thickness.

10. The method of claim 1, wherein said substrate is silicon.

11. A method for fabricating a semiconductor integrated circuit comprising the steps of providing a substrate, forming a first dielectric layer over an upper surface of said substrate, forming a contact hole in said first dielectric layer and extending to said upper surface of said substrate, selectively depositing a metal so as to fill said contact hole with said metal, forming a thin silicon layer overlying the remaining portion of said first dielectric layer and over said metal-filled contact hole, forming a second dielectric layer over said thin silicon layer, using said silicon layer as an etching stop, selectively removing portions of said second dielectric layer thereby to form at least one trench in said second dielectric layer overlying said metal-filled contact hole, depositing a layer of a metal onto the exposed portion of said thin silicon layer and said upper surface of the remaining portion of said second dielectric layer, and reacting said lastmentioned metal with said thin silicon layer to form a metal silicide layer wherever said metal is in contact with said thin silicon layer.

12. The method of claim 11, in which at least one of said metals is tungsten.

13. The method of claim 12, in which said last-mentioned metal is selected from the group consisting of cobalt, titanium, platinum, tungsten, molybdenum, tantalum, and palladium.

* * * * *